United States Patent
Gao et al.

(10) Patent No.: US 11,245,087 B2
(45) Date of Patent: Feb. 8, 2022

(54) DISPLAY SUBSTRATE AND ITS MANUFACTURING METHOD

(71) Applicant: BOE Technology Group Co., Ltd., Beijing (CN)

(72) Inventors: Xinwei Gao, Beijing (CN); Peng Li, Beijing (CN); Dandan Zang, Beijing (CN); Qihe Chen, Beijing (CN); Xiaoning Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 50 days.

(21) Appl. No.: 16/640,050

(22) PCT Filed: Jul. 24, 2019

(86) PCT No.: PCT/CN2019/097550
§ 371 (c)(1),
(2) Date: Feb. 18, 2020

(87) PCT Pub. No.: WO2020/191966
PCT Pub. Date: Oct. 1, 2020

(65) Prior Publication Data
US 2021/0135148 A1 May 6, 2021

(30) Foreign Application Priority Data
Mar. 28, 2019 (CN) .......................... 201910245000.0

(51) Int. Cl.
*H01L 29/08* (2006.01)
*H01L 51/52* (2006.01)
(Continued)

(52) U.S. Cl.
CPC ...... *H01L 51/5228* (2013.01); *H01L 51/5012* (2013.01); *H01L 51/5237* (2013.01); *H01L 51/56* (2013.01)

(58) Field of Classification Search
CPC ............ H01L 51/5228; H01L 51/5012; H01L 51/5237; H01L 51/56
See application file for complete search history.

(56) References Cited

U.S. PATENT DOCUMENTS

2006/0113900 A1    6/2006   Oh
2014/0367705 A1*  12/2014   Bibl .................... H01L 27/0203
                                                              257/88
(Continued)

FOREIGN PATENT DOCUMENTS

CN    103296052 A    9/2013
CN    107331691 A    11/2017
(Continued)

OTHER PUBLICATIONS

CN201910245000_OA1.
(Continued)

*Primary Examiner* — Phuc T Dang
(74) *Attorney, Agent, or Firm* — IPro, PLLC

(57) ABSTRACT

Disclosed herein is a display substrate comprising: first electrode; an auxiliary electrode; a first layer of an electrically insulating material over the auxiliary electrode, wherein the first layer does not cover a first portion of a sidewall of the auxiliary electrode; a second layer of a material that exhibits electroluminescence (EL), wherein the second layer is in electric contact with the first electrode and does not cover the first portion of the sidewall; a second electrode in electric contact with the second layer and in electric contact with the auxiliary electrode at the first portion of the sidewall.

15 Claims, 7 Drawing Sheets

(51) Int. Cl.
*H01L 51/50* (2006.01)
*H01L 51/56* (2006.01)

(56) References Cited

U.S. PATENT DOCUMENTS

| | | | | |
|---|---|---|---|---|
| 2016/0035813 A1* | 2/2016 | Lee | ................. | H01L 51/5228 |
| | | | | 257/40 |
| 2016/0308162 A1* | 10/2016 | Yoo | ................. | H01L 27/3244 |
| 2017/0062758 A1* | 3/2017 | Park | ................. | H01L 51/5036 |
| 2017/0141168 A1* | 5/2017 | Choi | ................. | H01L 27/32 |

FOREIGN PATENT DOCUMENTS

| | | |
|---|---|---|
| CN | 108511489 A | 9/2018 |
| CN | 109962177 A | 7/2019 |
| WO | 2020191966 A1 | 10/2020 |

OTHER PUBLICATIONS

CN201910245000_OA1_EN.
CN201910245000_OA2.
CN201910245000_OA2_EN.
PCTCN2019097550_ISR.

* cited by examiner

| Forming a first electrode layer located in the electroluminescent zone and an auxiliary electrode layer located in the non-electroluminescent zone on a support; the first electrode layer comprises a plurality of first electrodes; the auxiliary electrode layer comprises a plurality of auxiliary electrodes; the first electrodes and the auxiliary electrodes are insulated from each other. | — S100 |

| Forming a pixel definition layer on the first electrode layer and the auxiliary electrode layer. The pixel definition layer is located in the non-electroluminescent zone. The pixel definition layer has a first hollowed-out zone in the non-electroluminescent zone, to expose side surfaces of the auxiliary electrodes. | — S101 |

| Forming an electroluminescent function layer on the pixel definition layer; the electroluminescent function layer breaks at a boundary of the first hollowed-out zone, to expose side surfaces of the auxiliary electrodes. | — S102 |

| Forming a second electrode layer on the electroluminescent function layer. The second electrode layer is in contact with side surfaces of the auxiliary electrodes. | — S103 |

Fig. 5

DISPLAY SUBSTRATE AND ITS MANUFACTURING METHOD

TECHNICAL FIELD

The disclosure herein relates to the technical field of display, particularly relates to a display substrate such as an OLED (Organic Light Emitting Diode) display substrate.

BACKGROUND

An OLED display device has advantages such as: self-emitting light, quick response speed, high brightness, full view angle, flexible display, etc. It has become the next-generation display device and has a very competitive and promising future.

An OLED display device may be bottom-emitting or top-emitting. A top-emitting OLED display device may offer higher aperture ratio and higher PPI (pixels per inch) than its bottom-emitting counterpart. However, a top-emitting OLED display device uses a transparent or translucent conductive material in its cathode, which leads to relatively high electric resistance and large voltage drop ("IR-drop") across the cathode due to the small thickness of the transparent or translucent conductive material. The relatively high electric resistance and large IR-drop across the cathode negatively affect the uniformity of brightness of the OLED display device.

SUMMARY

Disclosed herein is a display substrate comprising: a first electrode; an auxiliary electrode; a first layer of an electrically insulating material over the auxiliary electrode, here, the first layer does not cover a first portion of a sidewall of the auxiliary electrode; a second layer of a material that exhibits electroluminescence (EL), here, the second layer is in electric contact with the first electrode and does not cover the first portion of the sidewall; a second electrode in electric contact with the second layer and in electric contact with the auxiliary electrode at the first portion of the sidewall.

According to an embodiment, the first electrode, the auxiliary electrode and a portion of the second layer are directly on a same support.

According to an embodiment, the first layer overhangs the first portion of the sidewall.

According to an embodiment, the first layer does not entirely cover the first electrode.

According to an embodiment, the first portion of the sidewall faces away from first electrode.

According to an embodiment, the display substrate comprises a pixel region and an inter-pixel region; wherein the first electrode is in the pixel region and the auxiliary electrode is in the inter-pixel region.

According to an embodiment, the auxiliary electrode consists of a homogenous composition.

According to an embodiment, the auxiliary electrode comprises a layered structure.

According to an embodiment, the second electrode is in direct physical contact with the auxiliary electrode at the first portion of the sidewall.

According to an embodiment, the auxiliary electrode comprises a material selected from the group consisting of Mo, Cu, Mg, Ag, Nb, Al, any mixtures thereof, and any alloys thereof.

According to an embodiment, the second electrode covers the first layer, the second layer, and the first electrode.

According to an embodiment, a portion of the second layer is directly on a second portion of the sidewall.

According to an embodiment, the second electrode is a cathode of the second layer.

According to an embodiment, the auxiliary electrode comprises a plurality auxiliary electrode portions between two adjacent rows of pixel regions, each row of the pixel regions arranged along an extension direction of a grid line of the display substrate.

According to an embodiment, the display substrate further comprises a thin-film transistor (TFT) electrically connected to the first electrode.

Disclosed herein is a display panel, comprising any of the above display substrates.

According to an embodiment, the display panel further comprises an encapsulation layer over the display substrate.

Disclosed herein is a system comprising the above display panel. The system is an e-book reader, a laptop computer, a computer monitor, a mobile phone, a tablet computer, a television, a display screen, a digital photo frame, or a portable GPS system.

Disclosed herein is a method comprising: forming a first layer of an electrically insulating material over an auxiliary electrode, here, the first layer does not cover a first portion of a sidewall of the auxiliary electrode; forming a second layer of a material that exhibits electroluminescence (EL), here, the second layer is in electric contact with a first electrode and does not cover the first portion of the sidewall; and forming a second electrode in electric contact with the second layer and in electric contact with the auxiliary electrode at the first portion of the sidewall. The term "in electric contact with" does not exclude the presence of an intermediate layer. For example, the second electrode in electric contact with the second layer does not exclude the presence of an intermediate layer physically disposed between the second electrode and the second layer.

According to an embodiment, the first electrode, the auxiliary electrode and a portion of the second layer are directly on a same support.

According to an embodiment, the first layer overhangs the first portion of the sidewall.

According to an embodiment, the first layer does not entirely cover the first electrode.

According to an embodiment, the first portion of the sidewall faces away from first electrode.

According to an embodiment, the second electrode covers the first layer, the second layer, and the first electrode.

According to an embodiment, forming the second electrode comprises using conformal deposition.

According to an embodiment, forming the second layer comprises using directional deposition.

According to an embodiment, forming the first layer comprises exposing the first portion of the sidewall by selectively removing the electrically insulating material covering the first portion of the sidewall.

According to an embodiment, removing the electrically insulating material covering the first portion of the sidewall comprises selectively dispensing a droplet of etchant to the electrically insulating material covering the first portion of the sidewall.

BRIEF DESCRIPTION OF FIGURES

FIG. 5 schematically shows a flowchart of a method to make a display substrate, according to an embodiment.

FIG. 12a schematically shows dripping solvent into a hollowed-out zone of the pixel definition layer body shown in FIG. 11a.

DETAILED DESCRIPTION

Figure 1:
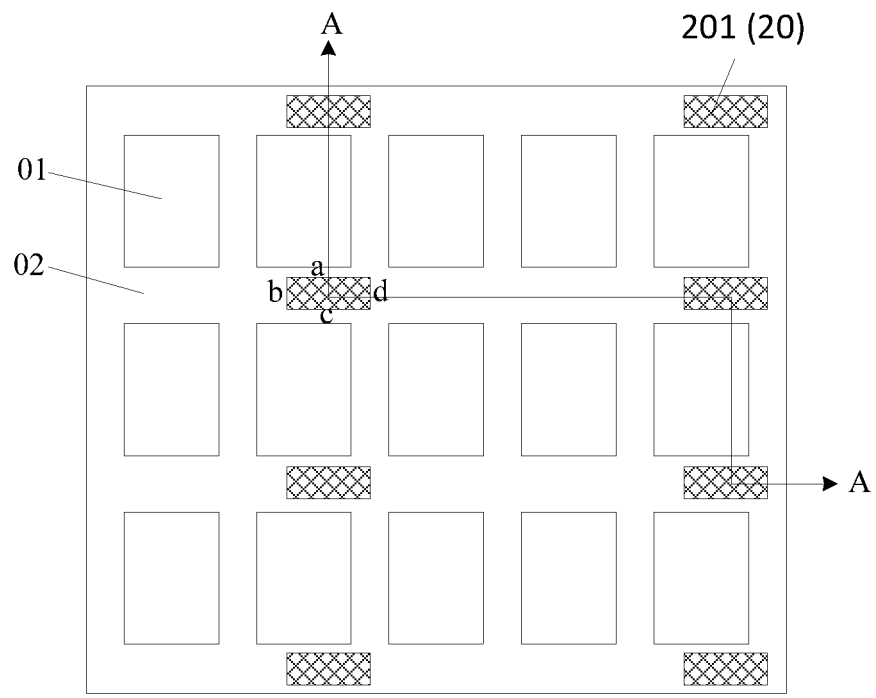
FIG. 1 schematically shows a structural diagram of a display substrate, according to an embodiment.

A display substrate, as shown in FIG. 1 according to an embodiment, may be divided into light-emitting zones 01 and a non-light-emitting zone 02. In the example shown here, one light-emitting zone 01 includes one sub-pixel. The term "light-emitting zone" is used interchangeably herein with the term "pixel region." The term "non-light-emitting zone" is used interchangeably herein with the term "inter-pixel region."

Figure 2:
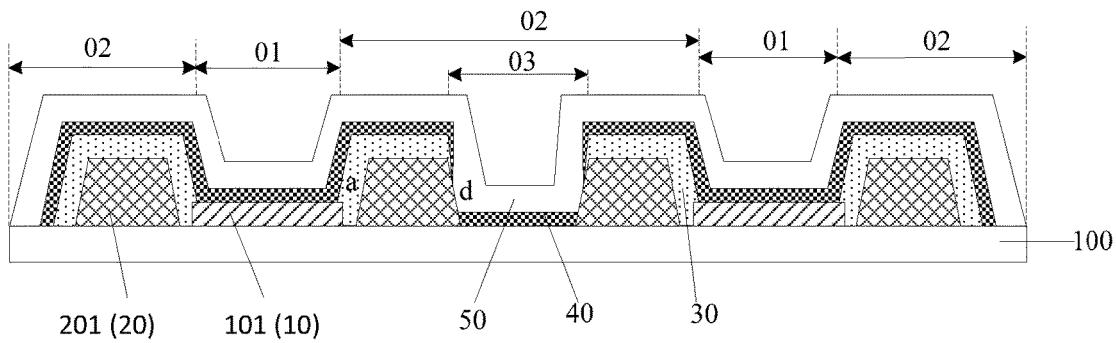
FIG. 2 is a section view 1 along AA in FIG. 1.

As shown in FIG. 2, the display substrate includes a first electrode 10, an auxiliary electrode 20, a first layer 30 of an electrically insulating material over the auxiliary electrode 20, a second layer 40 of a material that exhibits electroluminescence (EL), and a second electrode 50. The first layer 30 does not cover a first portion of a sidewall of the auxiliary electrode 20. The first portion of the sidewall of the auxiliary electrode 20 may be the entirety of the sidewall or less than the entirety of the sidewall. The first portion of the sidewall may face away from the first electrode 10. The first layer 30 may or may not entirely cover the first electrode 10. The second layer 40 is in electric contact with the first electrode 10 and does not cover the first portion of the sidewall of the auxiliary electrode 20. A portion of the second layer 40 may be directly on a second portion of the sidewall of the auxiliary electrode 20. The second electrode 50 is in electric contact with the second layer 40 and in electric contact with the auxiliary electrode 20 at the first portion of the sidewall of the auxiliary electrode 20. The second electrode 50 may cover the first layer 30, the second layer 40, and the first electrode 10. The display substrate may further include a thin-film transistor (TFT) electrically connected to the first electrode 10.

The first electrode 10 may be in one of the light-emitting zones 01. The auxiliary electrode 20 may be in the non-light-emitting zone 02. The first electrode 10 and the auxiliary electrode 20 may be on a support 100. The first electrode 10 may include a plurality of first electrode portions 101. The auxiliary electrode 20 may include a plurality of auxiliary electrode portions 201. The first electrode portions 101 and the auxiliary electrode portions 201 may be spatially separate from one another. The first layer 30 may serve as a pixel definition layer (PDL) and hereafter may be interchangeably referred to as the pixel definition layer 30. The first layer 30 may be arranged on the first electrode 10 and the auxiliary electrode 20. The first layer 30 may be in the non-light-emitting zone 02. The first layer 30 may have a first hollowed-out zone 03 in the non-light-emitting zone 02. The first portion of the sidewall of the auxiliary electrode 20 may be in the first hollowed-out zone 03.

The second layer 40 hereafter may be interchangeably referred to as the electroluminescent function layer 40. The second layer 40 may be arranged on the first layer 30. The second layer 40 may have a discontinuity at a periphery of the first hollowed-out zone 03. The first portion of the sidewall of the auxiliary electrode 20 may be in the discontinuity. The second electrode 50 may be arranged on the second layer 40. In an example, the first electrode 10, the auxiliary electrode 20 and a portion of the second layer 40 are directly on the support 100.

An auxiliary electrode portion 201 may include a "lower" surface facing the support 100 and an "upper" surface opposite the lower surface. The upper surface and the lower surface both may be parallel to the support 100. Surfaces of the auxiliary electrode portion 201 except the upper surface and the lower surface may be referred to as side surfaces. The auxiliary electrode portion 201 may include a plurality of side surfaces.

The first electrode 10 may function as an anode, and the second electrode 50 may function as a cathode, or vice versa.

The material of the first electrode portions 101 and the material of the auxiliary electrode portions 201 may be same or different. The height of the first electrode portions 101 and the height of the auxiliary electrode portions 201 may be same or different. In some embodiments, the height of the auxiliary electrode portions 201 is greater than the height of the first electrode portions 101.

Each of the light-emitting zones 01 may include one of the first electrode portions 101. There is no limit on the number of the auxiliary electrode portions 201. The larger the number of the auxiliary electrode portions 201 is, the larger the contact area between the second electrode 50 and side surfaces of the auxiliary electrode portions 201 is. In other words, the larger the number of the auxiliary electrode portions 201 is, the smaller the electric resistance of the second electrode 50 is. In some embodiments, the number of the auxiliary electrode portions 201 is the same as the number of pixels in the display substrate and each pixel includes one of the auxiliary electrode portions 201.

The first electrode 10 and the auxiliary electrode 20 may have any suitable material. In some embodiments, the first electrode 10 and the auxiliary electrode 20 may consist of a homogenous composition or comprise a layered structure. The layered structure may include IZO (Indium Zinc Oxide), ITO (Indium Tin Oxide), AZO (Al-doped-ZnO), Mo, Cu, Mg, Ag, Nb, Al, or their combinations (e.g., alloys and mixtures).

In some embodiments, the electroluminescent function layer 40 may additionally include one or more of: an electron transport layer (ETL), an electron injection layer (EIL) and a hole transporting layer (HTL) and a hole injection layer (HIL).

The second electrode 50 may have any suitable material. The second electrode 50 may be transparent or translucent to allow the light emitted by the electroluminescent function layer 40 to escape. In some embodiments, the second electrode 50 may consist of a homogenous composition or comprise a layered structure. The layered structure may include IZO (Indium Zinc Oxide), ITO (Indium Tin Oxide), AZO (Al-doped-ZnO), Mo, Cu, Mg, Ag, Nb, Al, or their combinations (e.g., alloys and mixtures). If the second electrode 50 consists of a homogenous composition, the second electrode 50 may have any suitable thickness (e.g., 300 to 1000 nm). If the second electrode 50 comprises a layered structure, the layered structure may include a first layer of Ag or Ag—Mg alloy and a second layer of IZO, ITO or AZO. The first layer may be closer to the electroluminescent function layer 40 than the second layer or vice versa. The first layer and the second layer may have any suitable thickness. For example, the first layer has a thickness of 2 to 20 nm and the second layer has a thickness of 300 to 1000 nm.

The second electrode 50 may be connected to a wire on the periphery of the display substrate, for controlling the display substrate.

The pixel definition layer 30 may have any suitable material. In some embodiments, the material of the pixel definition layer 30 is positive photoresist or negative photoresist, polystyrene or photosensitive resin, etc.

The pixel definition layer 30 may have any suitable thickness. In some embodiments, the range of the thickness of the pixel definition layer 30 is 0.2 to 2 μm. For example, the thickness of the pixel definition layer 30 can be 0.2 μm, 1.5 μm or 2 μm, etc.

Figure 3:
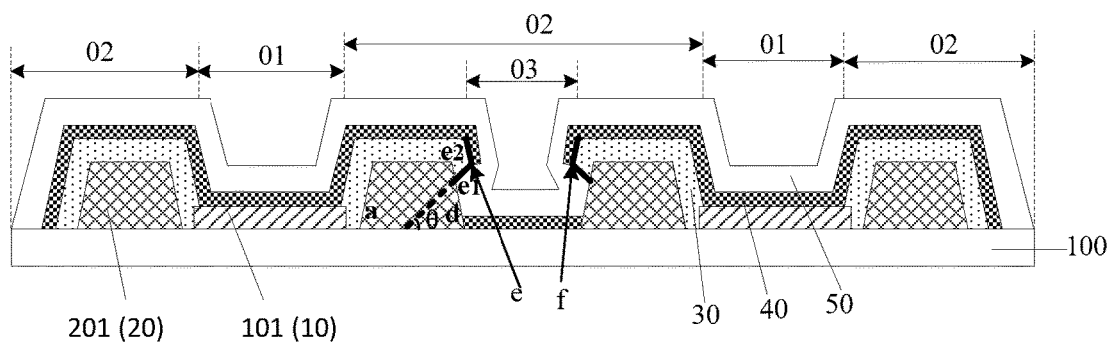
FIG. 3 is a section view 2 along AA in FIG. 1.

In an embodiment shown in FIG. 3, the first layer 30 overhangs the first portion of the sidewall.

The pixel definition layer 30 may include a "lower" surface facing the support 100 and an "upper" surface opposite the lower surface. The other surfaces of the pixel definition layer 30 may be referred to as side surfaces. The upper surface and the lower surface may be parallel to the support 100. With reference to FIG. 3, side surfaces of the pixel definition layer 30 located at the first hollowed-out zone 03 include a side surface e and a side surface f. The side surface e or side surface f may, as shown in FIG. 3, include two sections. Here, the angle θ between one of the sections in contact with the sidewall of the auxiliary electrode 20 and the support 100 is an acute angle. For example, with reference to FIG. 3, the side surface e has a section e1 and a section e2. The section e1 is in contact with the sidewall d of the auxiliary electrode 20 and the angle θ is between the section e1 and the support 100.

According to an embodiment, the overhang of the pixel definition layer 30 causes the discontinuity in the electroluminescent function layer 40 when the electroluminescent function layer 40 is formed on the pixel definition layer 30.

According to an embodiment, a display panel may include the display substrate described above. The display panel may include an encapsulation layer over the display substrate. According to an embodiment, a system may include the display panel. The system may be an e-book reader, a laptop computer, a computer monitor, a mobile phone, a tablet computer, a television, a display screen, a digital photo frame, or a portable GPS system.

The auxiliary electrode 20 may formed by forming a conductive thin film and etching the conductive thin film to form the auxiliary electrode portions 201. The thickness of the auxiliary electrode 20 may be 50 nm to 1.5 μm. For example, the thickness of the auxiliary electrode 20 may be 50 nm, 100 nm, 700 nm, 1 μm, or 1.5 μm, etc.

The auxiliary electrode 20 may have any suitable structure and material. In some embodiments, the auxiliary electrode 20 consists of a homogeneous composition with Mo, Cu, Ag, Nb or their combinations. In some embodiments, the auxiliary electrode 20 has a layered structure. For example, the auxiliary electrode 20 has three layers laminated to one another with the middle layer being Al, and the outer layers being Mo.

The auxiliary electrode portions 201 can be arranged at any position, for example, in the non-light-emitting zone 02. In some embodiments, as shown in FIG. 1, the auxiliary electrode portions 201 are between two adjacent rows of light-emitting zones 01, each row of the light-emitting zones 01 arranged along an extension direction of a grid line. In some embodiments, the auxiliary electrode portions 201 are between two adjacent columns of light-emitting zones 01, each column of the light-emitting zones 01 arranged along an extension direction of a data line. There may be a TFT in the non-light-emitting zone 02 between every two adjacent rows of the light-emitting zones 01. The width of the non-light-emitting zone 02 between every two adjacent rows of the light-emitting zones 01 may be larger than the width of the non-light-emitting zone 02 between every two adjacent columns of the light-emitting zones 01.

The auxiliary electrode portions 201 each may comprise a plurality of side surfaces. The plurality of side surfaces of the auxiliary electrode portion 201 comprises a side surface facing the first electrode portion 101 and a side surface that does not face the first electrode portion 101.

With reference to FIG. 1, FIG. 2 and FIG. 3, taking an auxiliary electrode portion 201 at the left side of the second row as an example, the side surfaces of the auxiliary electrode portion 201 comprise a side surface a, a side surface b, a side surface c and a side surface d. The side surface a and the side surface c face the first electrode portion 101 but the side surface b and the side surface d do not face the first electrode portion 101.

As shown in FIG. 2 and FIG. 3, the pixel definition layer 30 has a first hollowed-out zone 03 in the non-light-emitting zone 02 and the electroluminescent function layer 40 has a discontinuity at a periphery of the first hollowed-out zone 03. The first portion of the sidewall of the auxiliary electrode 20 may be on the side surface d, which does not face the first electrode portion 101. The first portion of the sidewall of the auxiliary electrode 20 may be on the side surface a, which faces the first electrode portion 101.

If the first portion of the sidewall of the auxiliary electrode 20 is on the side surface d, which does not face the first electrode portion 101, all or part of the pixel definition layer 30 on the side surfaces of the auxiliary electrode portions 201 not facing the first electrode portion 101 may be removed.

Figure 4:
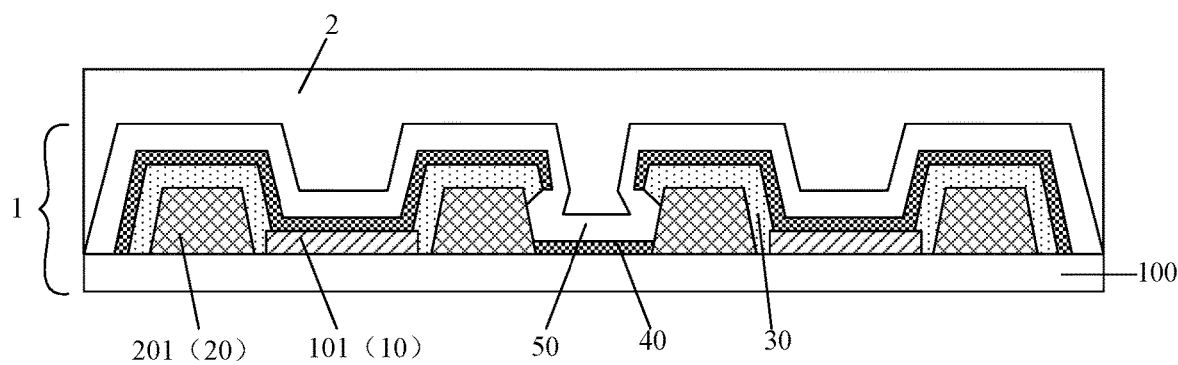
FIG. 4 schematically shows a structural diagram of a display substrate, according to an embodiment.

A display panel is schematically shown in FIG. 4. The display panel includes a display substrate 1 that is any of the display substrates described in this disclosure and an encapsulation layer 2 for encapsulating the display substrate 1.

In some embodiments, the encapsulation layer 2 is an encapsulating substrate. In some embodiments, the encapsulation layer 2 is an encapsulating film.

The display panel may be in a system that is capable of displaying moving images or still images. The system may be, but not limited to, mobile phone, wireless device, personal data assistant (PDA), handheld or portable computer, GPS receiver/navigator, camera, MP4 video player, camera, game control panel, watch, clock, calculator, television monitor, panel display, computer monitor, automobile display (for example, odometer display, etc.), navigator, cockpit controller and/or display, display of camera view (for example, display of rear view camera in a vehicle), electronic photo, electronic advertising board or indicating board, projector, architecture, packaging and aesthetic structures (for example, display of an image of a piece of jewelry) etc.

A method for making the display substrate, according to an embodiment, includes forming a first layer of an electrically insulating material over an auxiliary electrode, wherein the first layer does not cover a first portion of a sidewall of the auxiliary electrode; forming a second layer of a material that exhibits electroluminescence (EL), wherein the second layer is in electric contact with a first electrode and does not cover the first portion of the sidewall; and forming a second electrode in electric contact with the second layer and in electric contact with the auxiliary electrode at the first portion of the sidewall.

A method for making the display substrate, according to an embodiment, is schematically shown in FIG. 5-FIG. 10.

Figure 6:
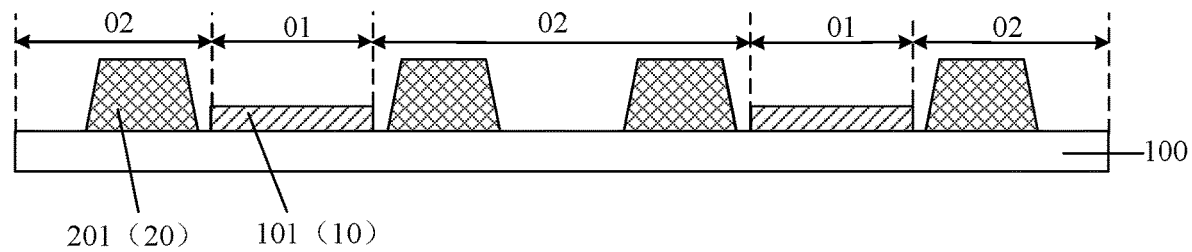
FIG. 6 schematically shows forming a first electrode and an auxiliary electrode on a support, according to an embodiment.

In procedure S100, as shown in FIG. 6, on the support 100, forming the first electrode 10 and the auxiliary electrode 20.

In some embodiments, the support 100 is a substrate. In some embodiments, the support 100 comprises a substrate, and a thin-film transistor (TFT) arranged on the substrate. The TFT may include a grid electrode, a gate insulating layer, a source electrode, a drain electrode and an active layer. The support 100 may also be called a backplane (BP) substrate. If the support 100 comprises a substrate and a TFT, in some embodiments, the support 100 further comprises a planarization layer on the TFT. The material of the planarization layer can be selected from resins, $SiN_x$, $SiO_x$, $SiO_xN_y$. In some embodiments, the material of the planarization layer is the same as the material of the pixel definition layer 30.

In some embodiments, the first electrode 10 is formed on the support 100 before the auxiliary electrode 20 is formed. In some embodiments, the auxiliary electrode 20 is formed on the support 100 before the first electrode 10 is formed. In some embodiments, the first electrode 10 and the auxiliary electrode 20 are simultaneously formed on the support 100. Forming the first electrode 10 on the support 100 may comprise: forming, for example, depositing, a first conductive thin film on the support 100, performing photolithography for the first conductive thin film to form a first conductive layer. Photolithography may include coating photoresist, mask exposure, developing and etching processes. The method of forming the auxiliary electrode 20 on the support 100 may be the same as forming the first electrode 10 on the support 100.

The material of a first electrode portion 101 and the material of an auxiliary electrode portion 201 may be the same or different. The height of the first electrode portion 101 and the height of the auxiliary electrode portion 201 may be the same or different. In some embodiments, as shown in FIG. 6, the height of the auxiliary electrode portion 201 is larger than the height of the first electrode portion 101.

Figure 7:
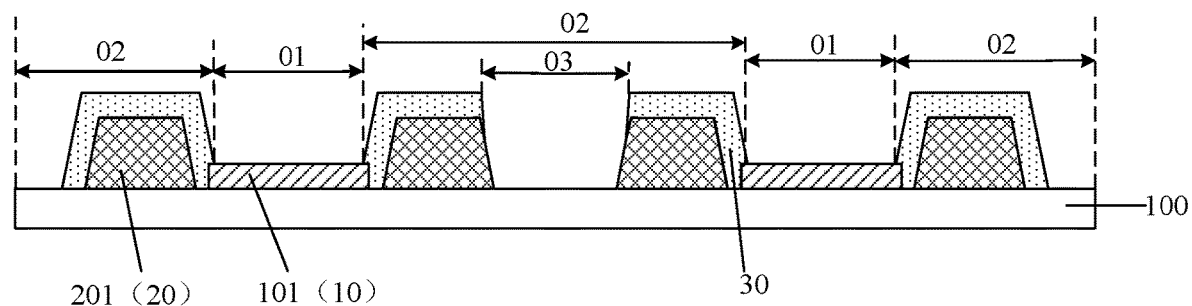
FIG. 7 schematically shows forming a pixel definition layer on the first electrode and the auxiliary electrode, according to an embodiment.
Figure 8:
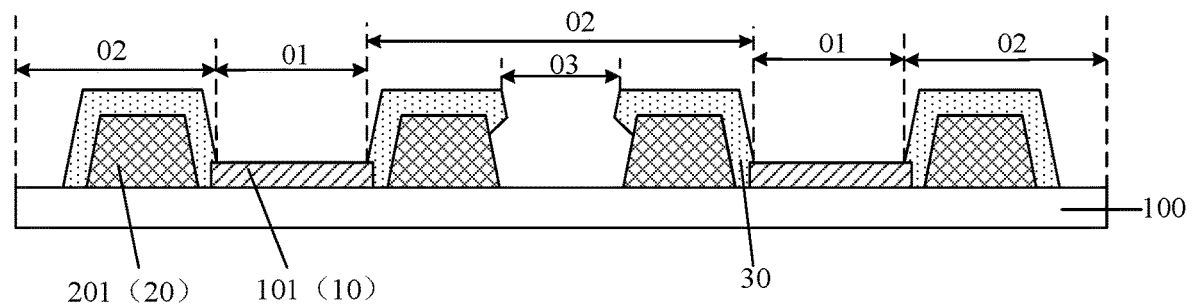
FIG. 8 schematically shows forming a pixel definition layer on the first electrode and the auxiliary electrode, according to an embodiment.

In procedure S101, as shown in FIG. 7 and FIG. 8, the pixel definition layer 30 is formed on the first electrode 10 and the auxiliary electrode 20. The pixel definition layer 30 may be in the non-light-emitting zone 02. The pixel definition layer 30 may have the first hollowed-out zone 03 in the non-light-emitting zone 02. The pixel definition layer 30 defines the plurality of light-emitting zones 01.

Figure 9:
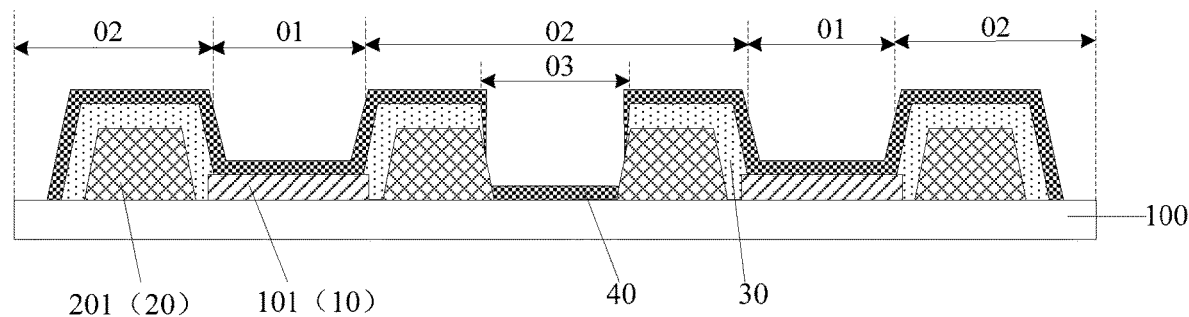
FIG. 9 schematically shows forming an electroluminescent function layer on the pixel definition layer, according to an embodiment.
Figure 10:
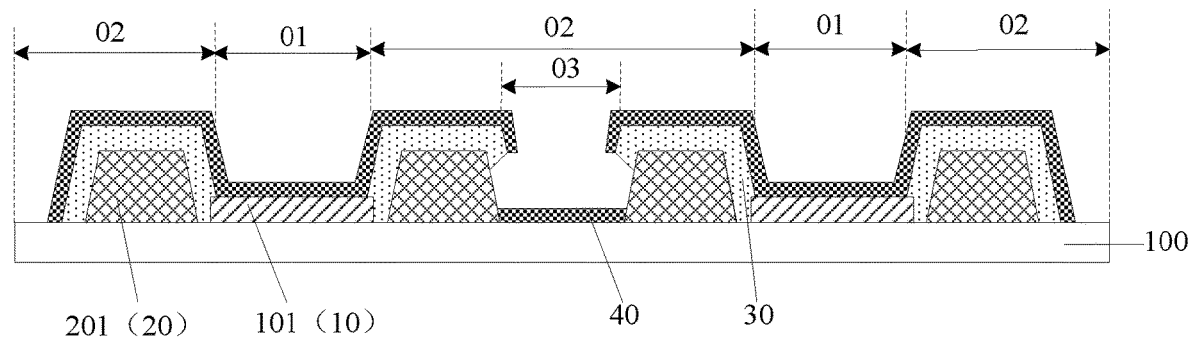
FIG. 10 schematically shows forming an electroluminescent function layer on the pixel definition layer, according to an embodiment.

In procedure S102, as shown in FIG. 9 and FIG. 10, the electroluminescent function layer 40 is formed, for example, deposited, on the pixel definition layer 30.

In procedure S103, as shown in FIG. 2 and FIG. 3, the second electrode 50 is formed, for example, deposited, on the electroluminescent function layer 40. The electroluminescent function layer 40 may be formed using an anisotropic deposition technique such as thermal evaporation.

In some embodiments, the second electrode 50 may be sputtered onto the electroluminescent functional layer 40, in order to cover the firs portion of the sidewall of the auxiliary electrode 20.

Figure 11A:
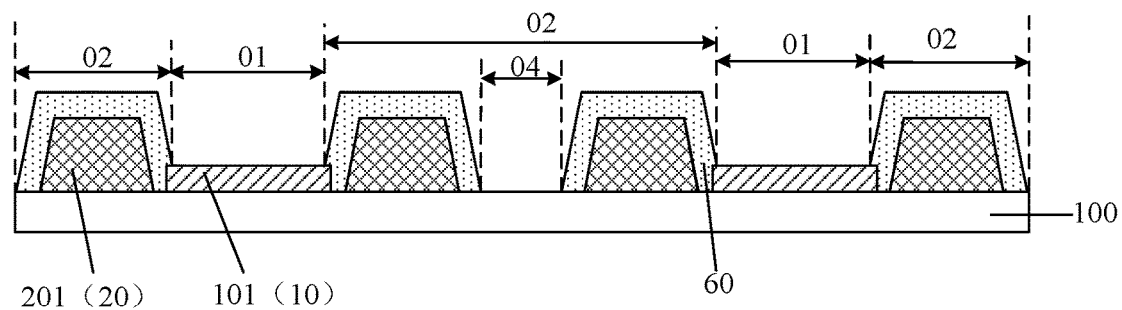
FIG. 11a schematically shows forming a pixel definition layer body on the first electrode and the auxiliary electrode, according to an embodiment.
Figure 11B:
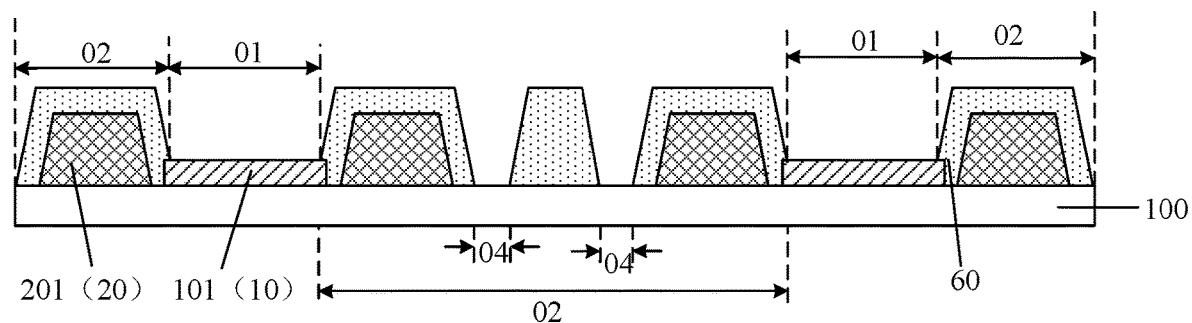
FIG. 11b schematically shows forming a pixel definition layer body on the first electrode and the auxiliary electrode, according to an embodiment.

In an embodiment, procedure S101 comprises:

A sub-procedure S200, as shown in FIG. 11a and FIG. 11b, in which a pixel definition layer body 60 is formed in the non-light-emitting zone 02. The pixel definition layer body 60 has a second hollowed-out zone 04 in the non-light-emitting zone 02.

The pixel definition layer body 60 may be formed by any suitable method. In an example, in sub-procedure S300, a pixel definition thin film is formed on the first electrode 10 and the auxiliary electrode 20 and in sub-procedure S301 photolithography is carried out to form the pixel definition layer body 60 in the non-light-emitting zone 02.

Here, carrying out photolithography may comprise mask exposure and developing process.

When photolithography for the pixel definition thin film is carried out, part of the pixel definition thin film located in the light-emitting zones 01 and part of the pixel definition thin film located in the second hollow-out zone 04 are etched away, so as to form the pixel definition layer body 60.

In an example, in sub-procedure S200, the pixel definition layer body 60 is formed in the non-light-emitting zone 02 using a printing process.

In some embodiments, an Ink-Jet Printing process (IJP) is used to form the pixel definition layer body 60 in the non-light-emitting zone 02. In some embodiments, the pixel definition layer body 60 is formed in the non-light-emitting zone 02 using a 3D printing process.

With reference to FIG. 11a and FIG. 11b, the cross-sectional area of the second hollowed-out zone 04 is larger at its end distal from the support 100 than at its end proximal to the support 100.

Figure 12A:
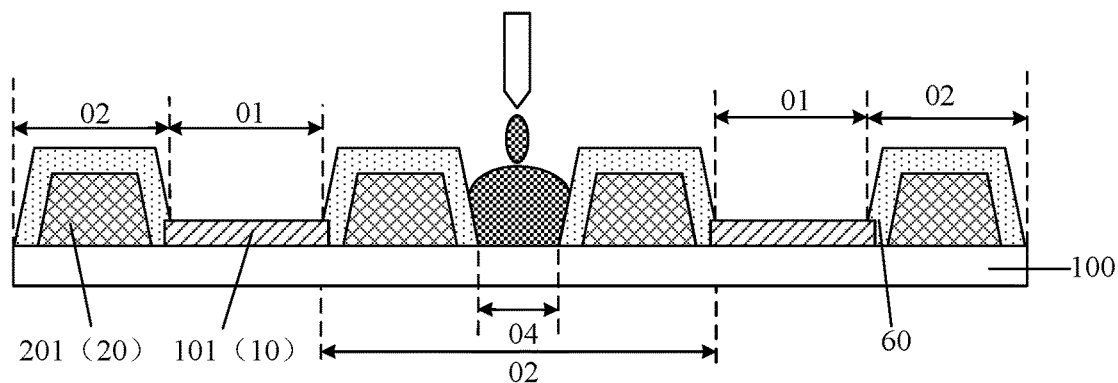
Figure 12B:
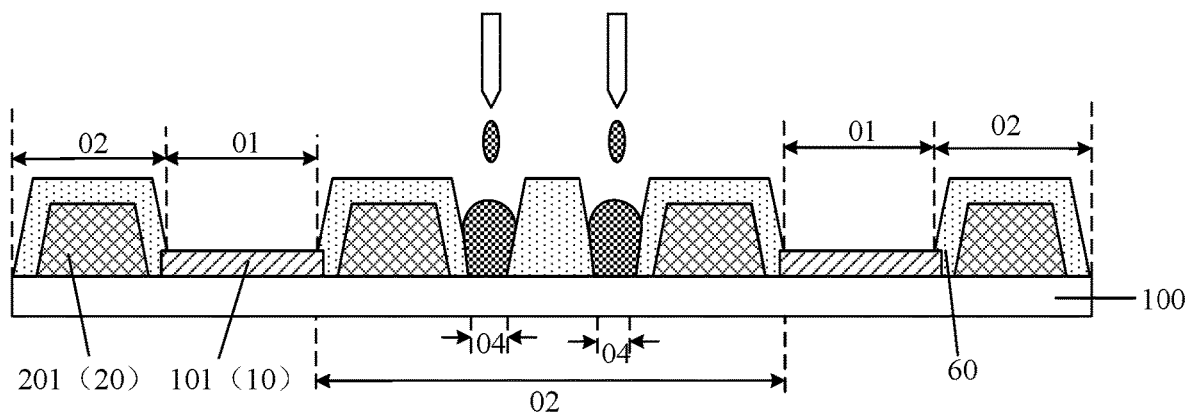
FIG. 12b schematically shows dripping solvent into a hollowed-out zone of the pixel definition layer body shown in FIG. 11b.

In procedure S201, as shown in FIG. 12a and FIG. 12b, solvent may be dripped into the second hollowed-out zone 04 of the pixel definition layer body 60. The solvent dissolves the pixel definition layer body 60 to form the first hollowed-out zone 03.

The solvent may be dripped by using a ink-jet printing process.

Here, corresponding solvent can be selected according to the material of the pixel definition layer body 60. For example, the solvent may be toluene, chloroform, esters, or other organic solvents, etc.

The amount of the solvent dripped can be controlled according to the thickness of the pixel definition layer body 60.

When the second hollowed-out zone 04 is on the pixel definition layer body 60, the second hollowed-out zone 04 is close to the auxiliary electrode portions 201. Thus, solvent is dripped into the second hollowed-out zone 04. If the distance between two adjacent auxiliary electrode portions 201 is relatively close, as shown in FIG. 11a, the second hollowed-out zone 04 can be arranged between two adjacent auxiliary electrode portions 201, and, as shown in FIG. 12a, solvent is dripped into the second hollowed-out zone 04.

Through controlling the amount of the solvent dripped into the second hollowed-out zone 04, the extent of overhang of the pixel definition layer 30 may be controlled.

In procedure S202, as shown in FIG. 8, the solvent and the dissolved material of the pixel definition layer body 60 may be removed. For example, water may be used to wash away the solvent and the dissolved material of the pixel definition layer body 60.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A display substrate comprising:
   a first electrode;
   an auxiliary electrode;
   a first layer of an electrically insulating material over the auxiliary electrode, wherein the first layer does not cover a first portion of a sidewall of the auxiliary electrode;
   a second layer of a material that exhibits electroluminescence (EL), wherein the second layer is in electric contact with the first electrode and does not cover the first portion of the sidewall;
   a second electrode in electric contact with the second layer and in electric contact with the auxiliary electrode at the first portion of the sidewall;
   wherein the first layer overhangs the first portion of the sidewall, or
   wherein the auxiliary electrode comprises a plurality auxiliary electrode portions between two adjacent rows of pixel regions and each row of the pixel regions arranged along an extension direction of a grid line of the display substrate.

2. The display substrate of claim 1, wherein the first portion of the sidewall faces away from the first electrode.

3. The display substrate of claim 1, wherein the second electrode is in direct physical contact with the auxiliary electrode at the first portion of the sidewall.

4. The display substrate of claim 1, wherein the second electrode is a cathode of the second layer.

5. The display substrate of claim 1, wherein the first layer does not entirely cover the first electrode.

6. The display substrate of claim 1, wherein the display substrate comprises a pixel region and an inter-pixel region; wherein the first electrode is in the pixel region and the auxiliary electrode is in the inter-pixel region.

7. The display substrate of claim 1, wherein the second electrode covers the first layer, the second layer, and the first electrode.

8. The display substrate of claim 1, wherein a portion of the second layer is directly on a second portion of the sidewall.

9. A display panel, comprising the display substrate of claim 1.

10. The display panel of claim 9, further comprising an encapsulation layer over the display substrate.

11. A system comprising the display panel of claim 10, wherein the system is an e-book reader, a laptop computer, a computer monitor, a mobile phone, a tablet computer, a television, a display screen, a digital photo frame, or a portable GPS system.

12. A method comprising:
    forming a first layer of an electrically insulating material over an auxiliary electrode, wherein the first layer does not cover a first portion of a sidewall of the auxiliary electrode;
    forming a second layer of a material that exhibits electroluminescence (EL), wherein the second layer is in electric contact with a first electrode and does not cover the first portion of the sidewall; and
    forming a second electrode in electric contact with the second layer and in electric contact with the auxiliary electrode at the first portion of the sidewall,
    wherein forming the first layer comprises exposing the first portion of the sidewall by selectively removing the electrically insulating material covering the first portion of the sidewall, or wherein removing the electrically insulating material covering the first portion of the sidewall comprises selectively dispensing a droplet of etchant to the electrically insulating material covering the first portion of the sidewall, or wherein the first layer overhangs the first portion of the sidewall.

13. The method of claim 12, wherein the first layer does not entirely cover the first electrode.

14. The method of claim 12, wherein the first portion of the sidewall faces away from first electrode.

15. The method of claim 12, wherein the second electrode covers the first layer, the second layer, and the first electrode.

* * * * *